(12) United States Patent
Chen et al.

(10) Patent No.: US 9,960,132 B1
(45) Date of Patent: May 1, 2018

(54) DISPLAY APPARATUS AND METHOD FOR BINDING THE SAME

(71) Applicant: BOE TECHNOLOGY GROUP CO., LTD., Beijing (CN)

(72) Inventors: Liqiang Chen, Beijing (CN); Huiji Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/503,710

(22) PCT Filed: May 6, 2016

(86) PCT No.: PCT/CN2016/081275
§ 371 (c)(1),
(2) Date: Feb. 13, 2017

(87) PCT Pub. No.: WO2017/133108
PCT Pub. Date: Aug. 10, 2017

(30) Foreign Application Priority Data

Feb. 4, 2016 (CN) .......................... 2016 1 0079289

(51) Int. Cl.
*H01L 51/52* (2006.01)
*H01L 23/00* (2006.01)
(Continued)

(52) U.S. Cl.
CPC ............ *H01L 24/09* (2013.01); *H01L 23/544* (2013.01); *H01L 24/06* (2013.01); *H01L 24/08* (2013.01);
(Continued)

(58) Field of Classification Search
None
See application file for complete search history.

(56) References Cited

U.S. PATENT DOCUMENTS

2006/0163724 A1* 7/2006 Hwang ............... G02F 1/13452
257/737
2010/0053721 A1* 3/2010 Chwu ............... G02F 1/133305
359/245
(Continued)

FOREIGN PATENT DOCUMENTS

CN 1441288 A 9/2003
CN 102540510 A 7/2012
(Continued)

OTHER PUBLICATIONS

First Chinese Office Action, for Chinese Patent Application No. 201610079289.X, dated Oct. 23, 2017, 13 pages.
(Continued)

*Primary Examiner* — Michael Lebentritt
(74) *Attorney, Agent, or Firm* — Kinney & Lange, P.A.

(57) ABSTRACT

Embodiments of the present application provide a display apparatus and a method for binding the same. The apparatus includes: a flexible display panel; and a chip on film bound on a binding region of the flexible display panel. The chip on film has at least two rows of output pads and the flexible display panel has at least two rows of input pads. Virtual elongation lines of all of the output pads intersect at a same intersection point in a first datum line perpendicular to the first direction. The output pads are electrically connected to the input pads and the output pads and the input pads have the virtual elongation lines at a same angle with respect to a common datum line, the common datum line being composed of the first datum line and the second datum line coinciding with each other.

20 Claims, 5 Drawing Sheets

(51) Int. Cl.
  *H01L 25/18* (2006.01)
  *H01L 27/12* (2006.01)
  *H01L 25/00* (2006.01)
  *H01L 23/544* (2006.01)

(52) U.S. Cl.
  CPC .............. *H01L 25/18* (2013.01); *H01L 25/50* (2013.01); *H01L 27/124* (2013.01); *H01L 27/1218* (2013.01); *H01L 2223/54426* (2013.01); *H01L 2224/06132* (2013.01); *H01L 2224/08052* (2013.01); *H01L 2224/08145* (2013.01); *H01L 2224/08225* (2013.01); *H01L 2224/0903* (2013.01); *H01L 2224/09132* (2013.01); *H01L 2224/8013* (2013.01)

(56) References Cited

U.S. PATENT DOCUMENTS

| | | | |
|---|---|---|---|
| 2015/0109550 A1* | 4/2015 | Shimizu | G02F 1/13452 349/33 |
| 2016/0270234 A1* | 9/2016 | Ahn | G06F 3/0412 |
| 2017/0086310 A1* | 3/2017 | Li | G02F 1/1345 |
| 2017/0146848 A1* | 5/2017 | Park | G02F 1/13306 |

FOREIGN PATENT DOCUMENTS

| | | |
|---|---|---|
| CN | 103249260 A | 8/2013 |
| CN | 104123902 A | 10/2014 |
| CN | 104280907 A | 1/2015 |
| CN | 104979316 A | 10/2015 |
| CN | 205376002 U | 7/2016 |
| EP | 2811337 A1 | 12/2014 |
| JP | 2008078341 A | 4/2008 |

OTHER PUBLICATIONS

International Search Report and Written Opinion dated Oct. 8, 2016, for corresponding PCT Application No. PCT/CN2016/081275.
International Search Report and Written Opinion (including English translation of Box V) dated Oct. 8, 2016, for corresponding PCT Application No. PCT/CN2016/081275.

* cited by examiner

DISPLAY APPARATUS AND METHOD FOR BINDING THE SAME

CROSS-REFERENCE TO RELATED APPLICATION

This application claims benefit of the Chinese Patent Application No. 201610079289.x, entitled with "Display Apparatus And Method For Binding The Same", filed with SIPO on Feb. 4, 2016, which is incorporated herein by reference in their entirety.

BACKGROUND OF THE DISCLOSURE

Field of the Disclosure

The present disclosure relates to the technical field of display, and in particular, to a display apparatus and a method for binding the same.

Description of the Related Art

Flexible display technology becomes hotpot of research in the display technical field in recent years. It will be applied widely in civil and military fields due to its advantages of low thickness, high resistance to shock and low weight. The flexible display may be defined that a substrate of a display panel may be made from a very thin flexible substrate. The substrate may be bent to have a curvature radius of several centimeters or less without degrading the display function of the display panel.

During producing the flexible display apparatus, typically, the flexible display panel will be produced after the flexible substrate is fixed on a glass substrate. Such producing process is compatible with the conventional apparatus for producing the display panel. After the process for producing the flexible display panel is finished, the flexible substrate is separated from the glass substrate. Then, a back film is adhered to a back surface of the flexible substrate to planarize the flexible substrate. Finally, the processes such as binding the chip on film (COF) are performed.

The flexible display panel is typically very thin after it has separated from the glass substrate. When the back film is adhered, it tends to force the flexible display panel to change its size slightly. In the subsequent operation of binding the COF, as the output pads on the COF are denser and more sensitive to the change of size, the change of size of the flexible display panel will cause for example misalignment between the pads on the flexible display panels and those on the COF or disconnection of circuit in binding the COF, so as to reduce yield.

SUMMARY

In view of above, embodiments of the present application provide a display apparatus and a method for binding the same.

In accordance with an aspect of the present application, it provides a display apparatus, comprising:
a flexible display panel; and
a chip on film bound on a binding region of the flexible display panel;
wherein the chip on film has at least two rows of output pads separated from each other, the at least two rows of output pads being arranged along a first direction, and virtual elongation lines of all of the output pads intersect at a same intersection point in a first datum line perpendicular to the first direction, and wherein in a same row of output pads, the farther a distance between the virtual elongation line of the output pad and the first datum line is, the larger an angle between said virtual elongation line and the first datum line becomes;

wherein the flexible display panel has at least two rows of input pads separated from each other, the at least two rows of input pads being arranged along a first direction, and the input pads are in one to one correspondence with the output pads, and wherein virtual elongation lines of all of the input pads intersect at a same intersection point in a second datum line perpendicular to the first direction, and wherein in a same row of input pads, the farther a distance between the virtual elongation line of the input pad and the second datum line is, the larger an angle between said virtual elongation line of said input pad and the second datum line becomes; and wherein each one of the output pads is electrically connected to each one of the input pads in one to one correspondence, and the input pads and the output pads that are, in one to one correspondence, electrically connected to each other have the virtual elongation lines at a same angle with respect to a common datum line, the common datum line being composed of the first datum line and the second datum line coinciding with each other.

In an embodiment, each one of the input pads has a smaller length in a direction of its virtual elongation line than one of the output pads in one to one correspondence with that one of the input pads.

In an embodiment, all of the output pads in the same row have a same height in a direction along the first datum line and all of the input pads in the same row have a same height in a direction along the second datum line.

In an embodiment, a distance between two adjacent rows of output pads is smaller than a distance between two adjacent rows of input pads.

In an embodiment, each one of the input pads has a greater width in the first direction than one of the output pads in one to one correspondence with that one the input pads.

In an embodiment, all of the output pads in the same row have a same width in the first direction and the width of the output pads in respective rows in the first direction increases as a distance between the output pads in the respective rows and the intersection point increases.

In an embodiment, the width of the input pads in the same row in the first direction increases as a distance between the input pads and the second datum line in the first direction increases.

In an embodiment, a distance between two adjacent output pads in the same row in the first direction increases as a distance between the output pads and the first datum line in the first direction increases.

In an embodiment, all of two adjacent input pads in the same row have a same distance between them in the first direction; and a distance between two adjacent input pads in respective rows in the first direction increases as a distance between the input pads in the respective rows and the intersection point increases.

In an embodiment, the input pads are symmetrical to the output pads with respect to the common datum line.

In an embodiment, the virtual elongation lines of the output pads in two rows respectively are distributed alternately; and the virtual elongation lines of the input pads in two rows respectively are distributed alternately.

In an embodiment, each one of the output pads is electrically connected to one of the input pads in one to one correspondence with that one of the output pads by a crimp connection.

In accordance with another aspect, it provides a method for binding the display apparatus as described in any one of the above embodiments, the method comprising:

aligning the flexible display panel with the chip on film by positioning their alignment markers in the first direction in a same line;

aligning the alignment markers with each other and then connecting the output pads and the input pads that are in one to one correspondence with each other by a crimp connection when determining that a first distance between two adjacent alignment markers on the flexible display panel in the first direction is equal to a second distance between two adjacent alignment markers on the chip on film in the first direction;

adjusting a relative position between the flexible display panel and the chip on film according to deviation between the first distance and the second distance and then connecting the output pads and the input pads that are in one to one correspondence with each other by the crimp connection when determining that the first distance between two adjacent alignment markers on the flexible display panel in the first direction is unequal to the second distance between two adjacent alignment markers on the chip on film in the first direction.

In an embodiment, adjusting the relative position between the flexible display panel and the chip on film according to deviation between the first distance and the second distance comprises:

adjusting a displacement between the flexible display panel and the chip on film in the first direction according to deviation between a center of the first distance and a center of the second distance;

determining the displacement h between the flexible display panel and the chip on film to be adjusted in a direction along the common datum line on the basis of the following equation:

$$h = \frac{l \cdot \cot\alpha}{2},$$

where l is the deviation between the first distance and the second distance, $\alpha$ is an angle between the virtual elongation line of the output pad with the alignment marker and the common datum line.

DETAILED DESCRIPTION OF PREFERRED EMBODIMENTS OF THE DISCLOSURE

In order that objectives, technical solutions and advantages of the present disclosure may become more apparent, examples of the display apparatus and the method for binding the same according to embodiments of the present application will be further explained below with reference to drawings.

Sizes and shapes of various parts in drawings are only intended to illustrate technical solutions of the present application and are not intended to limit scales of the display apparatus in real.

Figure 1:
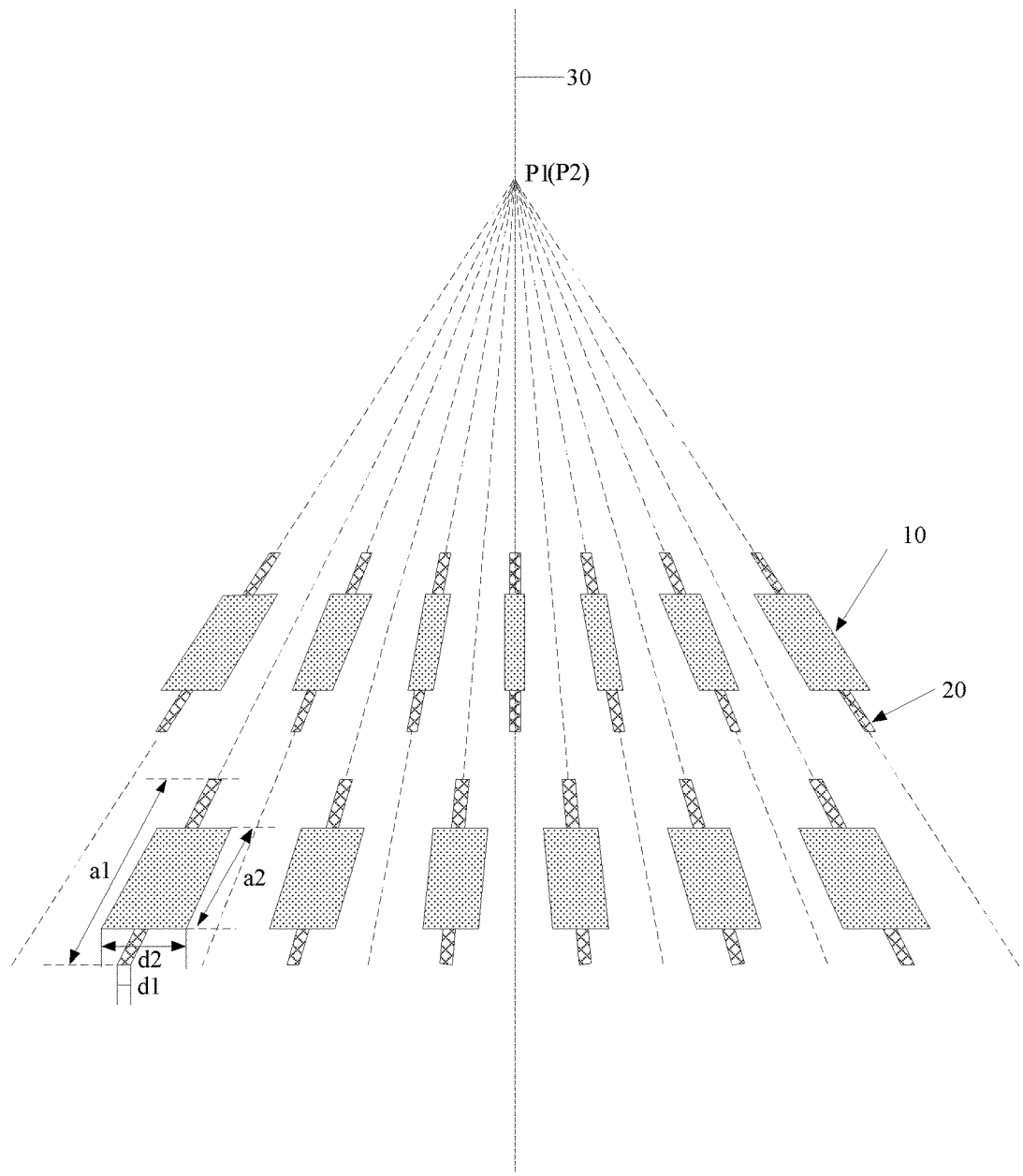
FIG. 1 is a schematic view showing a structure of a display apparatus according to an embodiment of the present application.

An embodiment of the present application provides a display apparatus. As illustrated in FIG. 1, the display apparatus includes: a flexible display panel 10 and a chip on film 20 bound on a binding region of the flexible display panel 10.

Figure 2:
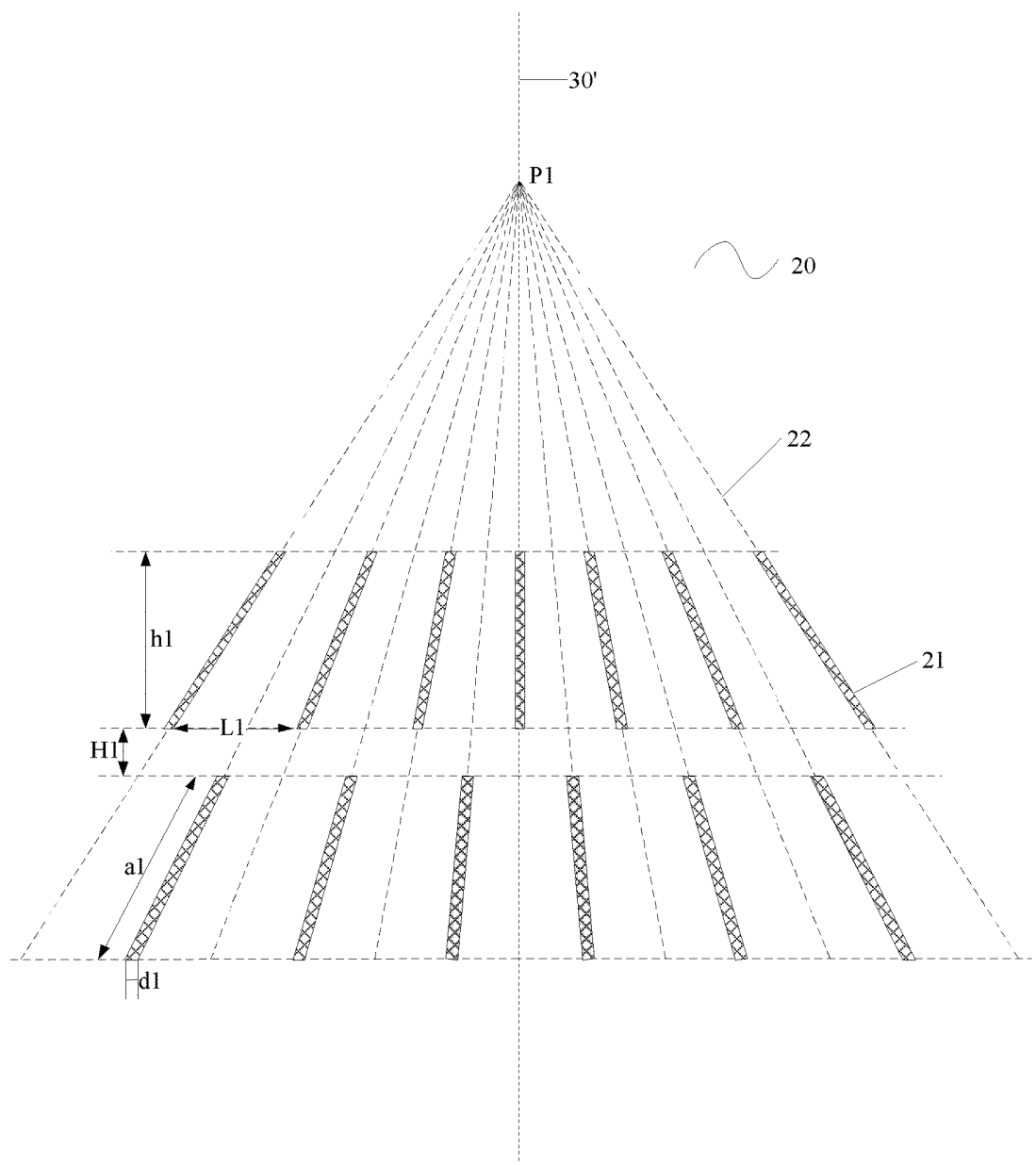
FIG. 2 is a schematic view showing a structure of a chip on film shown in FIG. 1.

As shown in FIG. 2, the chip on film 20 has at least two rows of output pads 21 separated from each other arranged along a first direction, and virtual elongation lines 22 of all of the output pads 21 intersect at a same intersection point P1 in a first datum line 30' perpendicular to the first direction. In a same row of output pads 21, the farther the distance between the virtual elongation line 22 of the output pad 21 and the first datum line 30' is, the larger the angle between the virtual elongation line 22 and the first datum line 30' becomes. FIG. 2 shows an example in which the chip on film 20 is provided with two rows of output pads 21.

Figure 3:
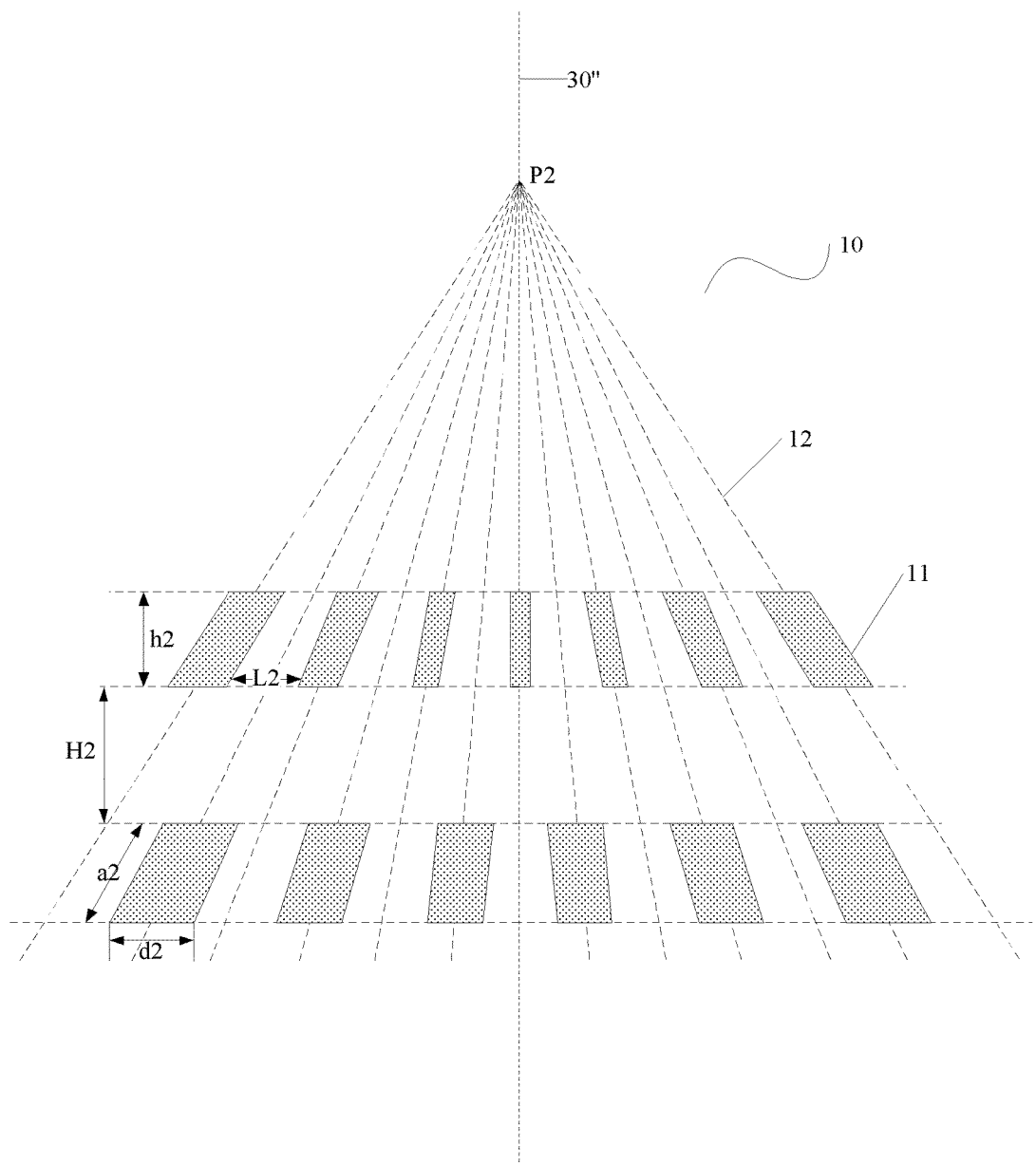
FIG. 3 is a schematic view showing a structure of a flexible display panel shown in FIG. 1.

As shown in FIG. 3, the flexible display panel 10 has at least two rows of input pads 11 separated from each other arranged along the first direction, and the input pads 11 are in one to one correspondence with the output pads 21. Virtual elongation lines 12 of all of the input pads 11 intersect at a same intersection point P2 in a second datum line 30" perpendicular to the first direction. In a same row of input pads 11, the farther the distance between the virtual elongation line 12 of the input pad 11 and the second datum line 30" is, the larger the angle between the virtual elongation line 12 of the input pad 11 and the second datum line 30" becomes. FIG. 3 shows an example in which the flexible display panel 10 is provided with two rows of input pads 11. In the example, for sake of brevity, the virtual elongation lines of the input pads 11 and the output pads 21 are explained taking their central elongation lines as an example. However, the skilled person in the art may also use other types of virtual elongation lines.

As shown in FIG. 1, each one of the output pads 21 is electrically connected to each one of the input pads 11 in one to one correspondence with the one of the output pads 21 by crimp connection. In this example, the first datum line 30' and the second datum line 30" coincide with each other completely (called collectively as a common datum line 30), thus the output pad 21 and input pad 11 that are electrically connected to each other have the virtual elongation lines 12, 22. The virtual elongation line 12 is at a same angle with respect to the second datum line 30" as the angle of the virtual elongation line 22 with respect to the first datum line 30'(i.e., the common datum line 30). That is, the output pad 21 and the input pad 21 that are in one to one correspondence with each other have the virtual elongation lines 12, 22 that coincide with each other.

It should be noted that the virtual elongation lines described in the above display apparatus provided by the embodiment of the present application are elongation lines that are virtually or not present in real along the extension directions of the corresponding input pads and output pads. And in FIGS. 1 to 3, the horizontal direction in the pager plane is defined as the first direction and the intersection points P1 and P2 coincide with each other after the chip on film 20 is bound to the flexible display panel 10.

For the above display apparatus provided by the embodiment of the present application, the output pads 21 and the input pads 11 that are in one to one correspondence with each other have a certain inclination angle with respect to the common datum line 30 and have the virtual elongation lines 12, 22 at a same angle with respect to the common datum line 30. Thus, when the size of the flexible display panel 10 changes in the first direction, binding the flexible display panel 10 to the chip on film 20 may be performed after adjusting relative position between the flexible display panel 10 and the chip on film 20 in a direction perpendicular to the first direction, such that correct alignment between the output pads 21 of the chip on film 20 and the input pads 11 of the flexible display panel 10 can be achieved as long as the size of the flexible display panel 10 changes in the first direction within a certain range, so as to improve yield and reliability of binding the display apparatus.

In an example, a peripheral region of the flexible display panel 10 is easier to produce change in size, i.e., to produce deformation, than a central region of the flexible display panel 10 when a force is applied to the flexible display panel 10. Thus, the input pads 11 and the output pads 21 may be provided with the common datum line 30 as a central axis when they are arranged corresponding to each other on the flexible display panel 10 and the chip on film 20 respectively, such that the input pads 11 and the output pads 21 away from the central axis have larger inclination angles with respect to the common datum line 30. In one example, in the above display apparatus provided by the embodiment of the present application, as shown in FIGS. 1-3, all of the input pads 11 are symmetrical to all of the output pads 21 with respect to the common datum line 30.

Further, in the above display apparatus provided by the embodiment of the present application, in order to meet the requirements that high resolution products have more signal channels, a plurality of output pads 21 are typically arranged in two rows on the chip on film 20. And as shown in FIG. 2, all of the output pads 21 arranged in the two rows respectively have virtual elongation lines 22 arranged alternately.

Figure 4:
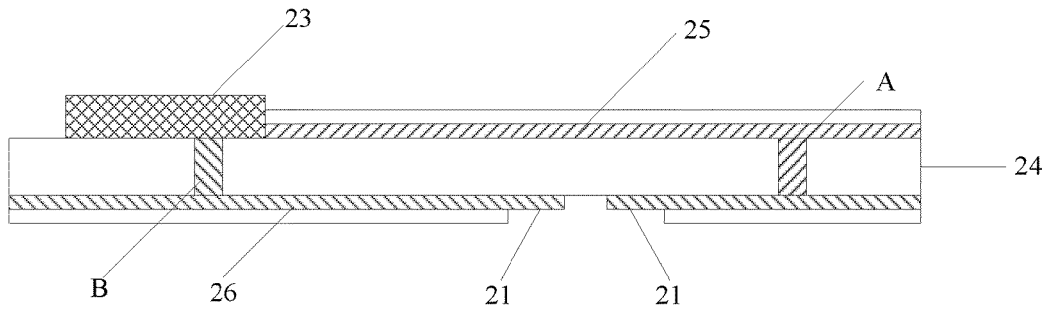
FIG. 4 is a schematic side view showing the chip on film shown in FIG. 1.

In the example, as shown in FIG. 4, the two rows of output pads 21 may be correspondingly connected to a chip 23 by a double layer of metal wiring on the chip on film 20. In an example, as shown in FIG. 4, the chip 23 is arranged on a side of a base substrate 24 of the chip on film 20. A first layer of metal wiring 25 is arranged on the side of the base substrate, and the first layer of metal wiring 25 has one end connected directly to the chip 23 and the other end connected to a row of output pads 21 (right side) by a via hole A through the base substrate 24. A second layer of metal wiring 26 is arranged on the other side of the base substrate 24 and the second layer of metal wiring 26 has one end connected directly to another row of output pads 21 (left side) and the other end connected to the chip 23 by a via hole B through the base substrate 24.

When all of the output pads 21 are arranged in two rows respectively on the chip on film 20 and all of the output pads 21 arranged in two rows respectively have virtual elongation lines 22 arranged alternately (as shown in FIG. 2), correspondingly, the input pads 11 will also need to be arranged in two rows respectively on the flexible display panel 10 and all of the input pads 11 arranged in two rows respectively will also have virtual elongation lines 12 arranged alternately (as shown in FIG. 3).

In a further embodiment, it is desired that the input pads 11 and the output pads 21 have same overlapping areas all along when the relative position between the flexible display panel 10 and the chip on film 20 in the direction perpendicular to the horizontal direction is adjusted, so as to keep uniformity in binding effects. As shown in FIG. 1, each one of the input pads 11 has a length a2 in its virtual elongation line 12 which is smaller than the length a1 of the one of the output pads 21 in one to one correspondence with the one of the input pads 11 in its virtual elongation line 22.

In a further embodiment, in order to control the crimping or contact area of the input pads and the output pads 21 in crimp connection conveniently, in the above display apparatus provided by the embodiment of the present application, as shown in FIG. 2, all of the output pads 21 in the same row have a same height h1 in a direction along the first datum line 30' and as shown in FIG. 3, all of the input pads 11 in the same row have a same height h2 in a direction along the second datum line 30".

In an example, on this basis, in the above display apparatus provided by the embodiment of the present application, a distance H1 between two adjacent rows of output pads 21 is smaller than a distance H2 between two adjacent rows of input pads 11.

In an example, it is desired that the input pads 11 and the output pads 21 may be aligned correctly when the size of the flexible display panel 10 changes in the horizontal direction slightly, so as to ensure binding reliability. In the above display apparatus provided by the embodiment of the present application, as shown in FIG. 1, each one of the input pads 11 has a width d2 in the first direction which is greater than the width d1 of the one of the output pads 21 in one to one correspondence with the one of the input pads 11 in the first direction.

In a further embodiment, when designing the output pads 21 of the chip on film 20, as shown in FIG. 2, it can ensure that all of the output pads 21 in the same row may have a same width d1 in the first direction and the width d1 of the output pads 21 in respective rows in the first direction increases as the distance between the output pads 21 in the respective rows and the intersection point P1 increases. That is, in FIG. 2, the width of the output pads 21 in an upper row in the first direction is smaller than the width of the output pads 21 in a lower row in the first direction.

Correspondingly, when the input pads 11 of the flexible display panel 10 are designed, as illustrated in FIG. 3, the width d2 of the input pads 11 in the same row in the first direction increases as the distance between the input pads 11 and the second datum line 30" in the first direction increases. That is, as an example, for the input pads 11 in the upper row in FIG. 3, the width d2 of the central input pad 11 in the first direction is minimum, and the smaller the distance between an edge and the input pad 11 is, the greater the width d2 in the first direction becomes. So do the input pads 11 in the lower row. And the minimum width of all of the input pads in the lower low in the first direction is greater than the maximum width of all of the input pads in the upper low in the first direction, that is, the width of the central input pads in the lower row in the first direction is greater or higher than that of the one of the input pads which is farthest from a center in the upper row in the first direction.

In a further embodiment, when the output pads 21 of chip on film 20 are designed, as shown in FIG. 2, a distance L1 between two adjacent output pads 21 in the same row in the first direction increases as the distance between the output pads 21 and the first datum line 30' in the first direction increases.

Correspondingly, when the input pads 11 on the flexible display panel 10 are designed, as shown in FIG. 3, all of two adjacent input pads 11 in the same row have a same distance L2 between them in the first direction; and a distance L2 between two adjacent input pads 11 in respective rows in the first direction increases as the distance between the input pads 11 in respective rows and the intersection point P2 increases. For example, in FIG. 3, the distance between two adjacent input pads in three central input pads 11 in the upper row is smaller than the distance between two adjacent input pads 11 which are farthest from a center in the upper row.

Figure 5:
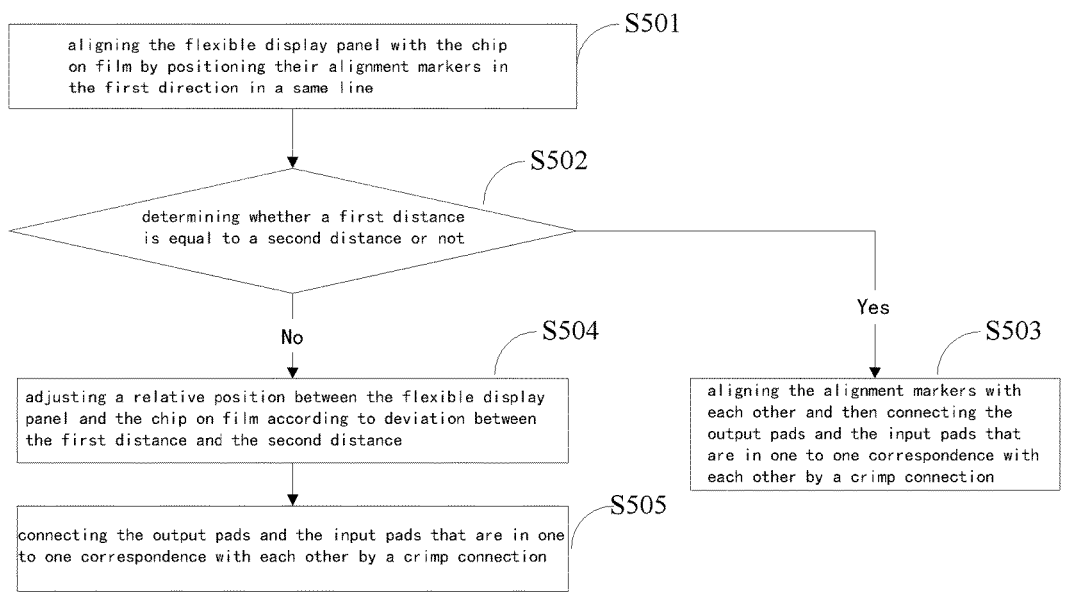
FIG. 5 shows a flow chart of a method for binding a display apparatus shown in FIG. 1, according to another embodiment of the present application.

In addition, another embodiment of the present application provides a method for binding the above display apparatus. As illustrated in FIG. 5, the method may include the following steps of:

Step S501 of aligning the flexible display panel with the chip on film by positioning their alignment markers in the first direction in a same line (that is, each of the flexible display panel and the chip on film is provided with a plurality of the alignment markers in advance);

Step S502 of determining whether a first distance between two adjacent alignment markers on the flexible display panel in the first direction is equal to a second distance between two adjacent alignment markers on the chip on film in the first direction or not; if yes, go to Step S503, otherwise, if not, go to Step S504;

Step S503 of aligning the alignment markers with each other and then connecting the output pads and the input pads that are in one to one correspondence with each other by crimp connection;

Step S504 of adjusting a relative position between the flexible display panel and the chip on film according to deviation between the first distance and the second distance;

Step S505 of connecting the output pads and the input pads that are in one to one correspondence with each other by crimp connection.

Figure 6:
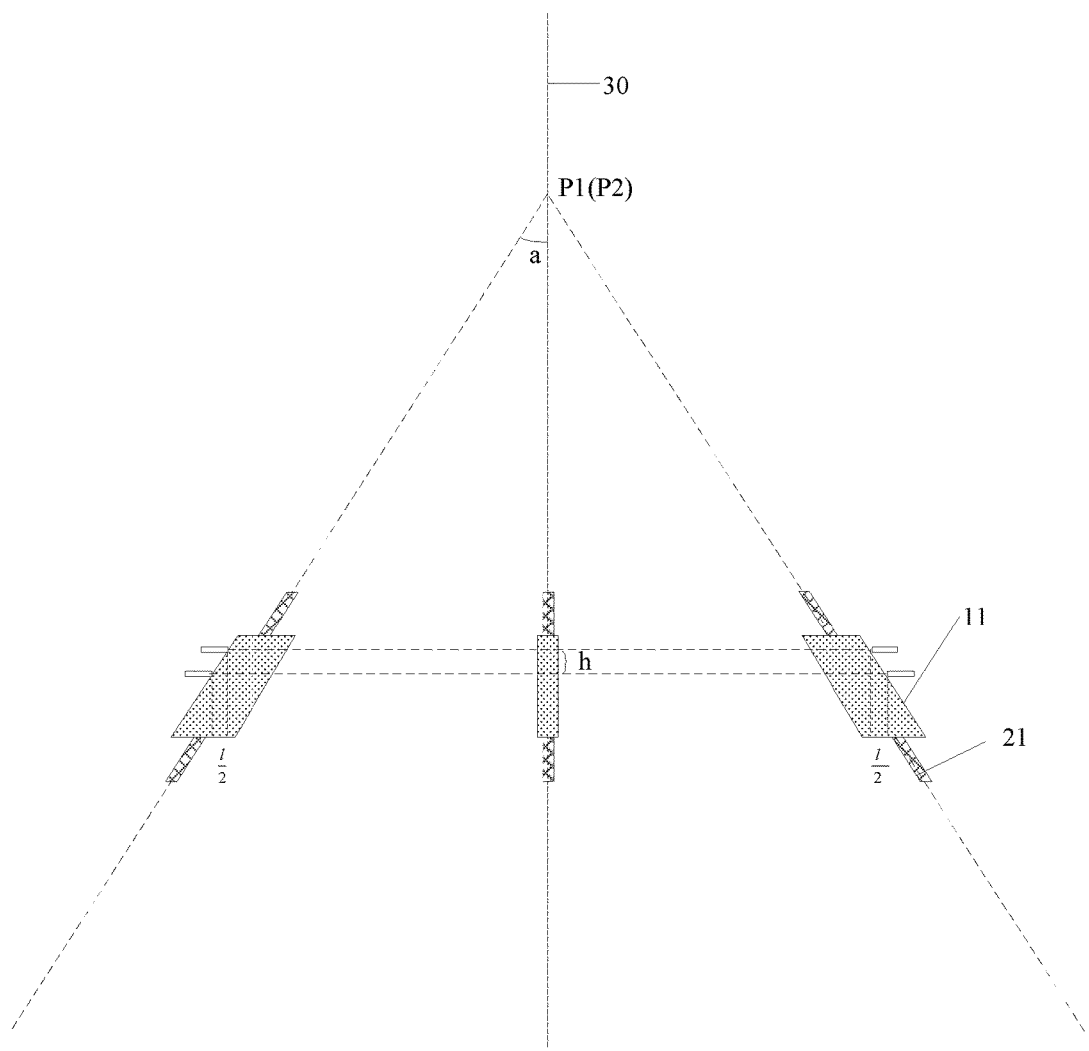
FIG. 6 shows an illustrative view of a method for binding a display apparatus according to another embodiment of the present application.

As an example, in the above method according to the embodiment of the present application, as illustrated in FIG. 6, in the above Step S504, adjusting the relative position between the flexible display panel and the chip on film according to the deviation between the first distance and the second distance includes:

adjusting a displacement between the flexible display panel and the chip on film in the first direction according to deviation between a center of the first distance and a center of the second distance;

determining the displacement h between the flexible display panel and the chip on film to be adjusted in a direction along the common datum line 30 on the basis of the following equation:

$$h = \frac{l \cdot \cot\alpha}{2},$$

where l is the deviation between the first distance and the second distance, α is an angle between the virtual elongation line of the output pad with the alignment marker and the common datum line 30. FIG. 6 only shows an example that one row of input pads 11 and one row of output pads 21 with alignment markers are provided.

The embodiments of the present application provide the above display apparatus and the method for binding the same. The display apparatus includes a flexible display panel and a chip on film bound on a binding region of the flexible display panel; wherein the chip on film has at least two rows of output pads separated from each other arranged along a first direction, and virtual elongation lines of all of the output pads intersect at a same intersection point in a first datum line perpendicular to the first direction, and the flexible display panel has at least two rows of input pads separated from each other arranged along a first direction, and the input pads are in one to one correspondence with the output pads, and wherein virtual elongation lines of all of the input pads intersect at a same intersection point in a second datum line. In this way, the output pads and the input pads that are in one to one correspondence with each other have the virtual elongation lines at a same angle with respect to the common datum line. Thus, when the size of the flexible display panel changes in the first direction, binding the flexible display panel to the chip on film may be performed after adjusting the relative position between the flexible display panel and the chip on film in a direction perpendicular to the first direction, such that correct alignment between the output pads of the chip on film and the input pads of the flexible display panel can be achieved as long as the size of the flexible display panel changes in the first direction within a certain range, so as to improve yield and reliability of binding the display apparatus.

Apparently, the skilled person in the art may make various modifications and alternations on the present disclosure without departing from the scope and spirit of the present disclosure. Thus, as long as these modifications and alternations fall within the scope of claims and equivalent thereof, they will also fall within the scope of the present application.

What is claimed is:

1. A display apparatus, comprising:
a flexible display panel; and
a chip on film bound on a binding region of the flexible display panel;
wherein the chip on film has at least two rows of output pads separated from each other, the at least two rows of output pads being arranged along a first direction, and virtual elongation lines of all of the output pads intersect at a same intersection point in a first datum line perpendicular to the first direction, and wherein in a same row of output pads, the farther a distance between the virtual elongation line of the output pad and the first datum line is, the larger an angle between said virtual elongation line and the first datum line becomes;
wherein the flexible display panel has at least two rows of input pads separated from each other, the at least two rows of input pads being arranged along the first direction, and the input pads are in one to one correspondence with the output pads, and wherein virtual elongation lines of all of the input pads intersect at a same intersection point in a second datum line perpendicular to the first direction, and wherein in a same row of input pads, the farther a distance between the virtual elongation line of the input pad and the second datum line is, the larger an angle between said virtual elongation line of said input pad and the second datum line becomes; and
wherein each one of the output pads is electrically connected to each one of the input pads in one to one correspondence, and the input pads and the output pads that are, in one to one correspondence, electrically connected to each other have the virtual elongation lines at a same angle with respect to a common datum line, the common datum line being composed of the first datum line and the second datum line coinciding with each other.

2. The display apparatus according to claim 1, wherein each one of the input pads has a smaller length in a direction of its virtual elongation line than one of the output pads in one to one correspondence with that one of the input pads.

3. The display apparatus according to claim 2, wherein all of the output pads in the same row have a same height in a direction along the first datum line and all of the input pads in the same row have a same height in a direction along the second datum line.

4. The display apparatus according to claim 3, wherein a distance between two adjacent rows of output pads is smaller than a distance between two adjacent rows of input pads.

5. The display apparatus according to claim 1, wherein each one of the input pads has a greater width in the first direction than one of the output pads in one to one correspondence with that one of the input pads.

6. The display apparatus according to claim 1, wherein all of the output pads in the same row have a same width in the first direction and the width of the output pads in respective rows in the first direction increases as a distance between the output pads in the respective rows and the intersection point increases.

7. The display apparatus according to claim 1, wherein the width of the input pads in the same row in the first direction increases as a distance between the input pads and the second datum line in the first direction increases.

8. The display apparatus according to claim 1, wherein a distance between two adjacent output pads in the same row in the first direction increases as a distance between the output pads and the first datum line in the first direction increases.

9. The display apparatus according to claim 1, wherein all of two adjacent input pads in the same row have a same distance between them in the first direction; and a distance between two adjacent input pads in respective rows in the first direction increases as a distance between the input pads in the respective rows and the intersection point increases.

10. The display apparatus according to claim 1, wherein the input pads are symmetrical to the output pads with respect to the common datum line.

11. The display apparatus according to claim 1, wherein the virtual elongation lines of the output pads in two rows respectively are distributed alternately; and the virtual elongation lines of the input pads in two rows respectively are distributed alternately.

12. The display apparatus according to claim 1, wherein each one of the output pads is electrically connected to one of the input pads in one to one correspondence with that one of the output pads by a crimp connection.

13. A method for binding the display apparatus according to claim 1, the method comprising:
aligning the flexible display panel with the chip on film by positioning their alignment markers in the first direction in a same line;
aligning the alignment markers with each other and then connecting the output pads and the input pads that are in one to one correspondence with each other by a crimp connection when determining that a first distance between two adjacent alignment markers on the flexible display panel in the first direction is equal to a second distance between two adjacent alignment markers on the chip on film in the first direction; and
adjusting a relative position between the flexible display panel and the chip on film according to deviation between the first distance and the second distance and then connecting the output pads and the input pads that are in one to one correspondence with each other by the crimp connection when determining that the first distance between two adjacent alignment markers on the flexible display panel in the first direction is unequal to the second distance between two adjacent alignment markers on the chip on film in the first direction.

14. The method according to claim 13, wherein adjusting the relative position between the flexible display panel and the chip on film according to deviation between the first distance and the second distance comprises:
adjusting a displacement between the flexible display panel and the chip on film in the first direction according to deviation between a center of the first distance and a center of the second distance;
determining the displacement h between the flexible display panel and the chip on film to be adjusted in a direction along the common datum line on the basis of the following equation:

$$h = \frac{l \cdot \cot\alpha}{2},$$

where l is the deviation between the first distance and the second distance, and $\alpha$ is an angle between the virtual elongation line of the output pad with the alignment marker and the common datum line.

15. The display apparatus according to claim 2, wherein each one of the input pads has a greater width in the first direction than one of the output pads in one to one correspondence with that one of the input pads.

16. The display apparatus according to claim 2, wherein all of the output pads in the same row have a same width in the first direction and the width of the output pads in respective rows in the first direction increases as a distance between the output pads in the respective rows and the intersection point increases.

17. The display apparatus according to claim 2, wherein the width of the input pads in the same row in the first direction increases as a distance between the input pads and the second datum line in the first direction increases.

18. The display apparatus according to claim 2, wherein a distance between two adjacent output pads in the same row in the first direction increases as a distance between the output pads and the first datum line in the first direction increases.

19. The display apparatus according to claim 2, wherein all of two adjacent input pads in the same row have a same distance between them in the first direction; and a distance between two adjacent input pads in respective rows in the first direction increases as a distance between the input pads in the respective rows and the intersection point increases.

20. The display apparatus according to claim 2, wherein the input pads are symmetrical to the output pads with respect to the common datum line.

* * * * *